(12) United States Patent
Gaku et al.

(10) Patent No.: US 6,350,952 B1
(45) Date of Patent: Feb. 26, 2002

(54) SEMICONDUCTOR PACKAGE INCLUDING HEAT DIFFUSION PORTION

(75) Inventors: Morio Gaku; Nobuyuki Ikeguchi; Toshihiko Kobayashi, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/402,400

(22) PCT Filed: May 11, 1999

(86) PCT No.: PCT/JP99/02416

§ 371 Date: Oct. 5, 1999

§ 102(e) Date: Oct. 5, 1999

(87) PCT Pub. No.: WO99/59205

PCT Pub. Date: Nov. 18, 1999

(30) Foreign Application Priority Data

May 12, 1998 (JP) ............................................. 10-145207
Aug. 20, 1998 (JP) ............................................. 10-250449
Aug. 31, 1998 (JP) ............................................. 10-260963

(51) Int. Cl.$^7$ ............................................. H01L 23/28
(52) U.S. Cl. ........................ 174/52.2; 257/774; 361/761
(58) Field of Search ........................ 174/52.2; 257/729, 257/753, 758, 762, 783, 774, 791; 361/748, 749, 760, 761, 767

(56) References Cited

U.S. PATENT DOCUMENTS 4,396,936 A * 8/1983 McIver et al. ................. 357/81
5,973,927 A * 10/1999 Tanaka ....................... 361/760

FOREIGN PATENT DOCUMENTS

JP 4-99051 3/1992
JP 6-104350 4/1994

* cited by examiner

Primary Examiner—Peter S. Wong
Assistant Examiner—Gary L. Laxton
(74) Attorney, Agent, or Firm—Wenderoth, Lind & Ponack, L.L.P.

(57) ABSTRACT

Disclosed is a semiconductor plastic package having a structure in which a metal sheet having a size nearly equivalent to a printed wiring board is disposed nearly in the central portion in the thickness direction of the printed wiring board. The metal sheet and a signal propagation conductive circuit on a front surface of the printed wiring board are insulated from each other with a thermosetting resin composition. The conductive circuit on the printed wiring board surface is connected to a conductive circuit formed on an opposite surface of the printed wiring board, or to a conductive circuit pad formed for being connected with solder balls with a conductive through hole. A semiconductor chip, wire and bonding pad are encapsulated with a resin. The semiconductor plastic package has at least one blind via hole made in the opposite surface so as to be directly connected to the metal sheet. The blind via hole has an inner wall rendered thermally conductive. The printed wiring board is provided, on the semiconductor-chip-mounting side, with an elevated metal portion, a plurality of metal protrusions each having the form of a frustum of a pyramid or a cone, or at least one via hole having an inner wall rendered thermally conductive. A process for the production of a printed wiring board used for the above plastic package is also disclosed.

23 Claims, 6 Drawing Sheets

SEMICONDUCTOR PACKAGE INCLUDING HEAT DIFFUSION PORTION

BACKGROUND OF THE INVENTION

The present invention relates to a novel semiconductor plastic package having a structure in which at least one semiconductor chip is mounted on a small-sized printed wiring board, and a method of producing a novel printed wiring board for a semiconductor plastic package. The printed wiring board has a metal sheet and is used for the above semiconductor plastic package. More specifically, the present invention relates to a method of producing a printed wiring board having a structure in which a via hole is, or via holes are, formed so as to be connected to an opposite surface or to front and opposite surfaces of a metal sheet, and the via hole is, or the via holes are, filled with, or the entire wall of the via hole(s) is coated with, a metal plating. The above printed wiring board is suitable for a relatively high-watt-consuming, multi-terminal-possessing and high-density semiconductor plastic package, i.e., for a microprocessor, a microcontroller, ASIC, graphic or the like. The semiconductor plastic package of the present invention is mounted on a mother board printed wiring board with solder balls, and the resultant unit is used as an electronic unit.

As a semiconductor plastic package, there is known a semiconductor plastic package having a structure in which a semiconductor chip is fixed on the upper surface of a plastic printed wiring board. The chip is bonded to a conductive circuit formed on the printed wiring board by wire bonding. Conductive pads for connection to a mother board are formed on the opposite surface of the printed wiring board with solder balls, conductive circuits on front and opposite surfaces are connected with a plated through hole, and the semiconductor chip is encapsulated with a resin. The semiconductor plastic package is known as a plastic ball grid array (P-BGA) or plastic land grid array (P-LGA). In the above known structure, a plated through hole for heat diffusion is formed, which plated through hole is connected from an upper-surface metal foil, on which a semiconductor chip is fixed, to a lower surface for diffusing heat generated by the semiconductor to the mother board printed wiring board.

Water is absorbed through the above through hole into a silver-powder-containing resin adhesive used for fixing the semiconductor. During heating, when a semiconductor part is mounted on the mother board or during heating when a semiconductor part is removed from the mother board, an interlayer swelling may take place, which is called a popcorn phenomenon. When the popcorn phenomenon takes place, the package is no longer usable in many cases, and thus it is desired to decrease the above phenomenon drastically. Further, a higher function and a higher density in a semiconductor results in an increase in the amount of heat to be generated, and the formation of only a through hole directly below the semiconductor chip is insufficient for heat diffusion.

The present invention therefore provides a semiconductor plastic package in which the water absorption from a reverse surface is prevented, and which is remarkably improved with regard to heat resistance after water absorption, i.e., drastically improved with regard to the popcorn phenomenon, excellent in heat diffusion, suitable for mass production and improved in economic performance. A method of producing a printed wiring board for use in the above plastic package is also provided. The present invention further provides a semiconductor plastic package which is excellent in electric insulation and migration resistance after subjected to a pressure cooker test, and a method of producing a printed wiring board.

SUMMARY OF THE INVENTION

According to the present invention, there is provided a semiconductor plastic package having a structure in which a metal sheet having a size nearly equivalent to a printed wiring board is disposed nearly in the central portion in the thickness direction of the printed wiring board. At least one semiconductor chip is fixed on one surface of the printed wiring board with a thermally conductive adhesive. The metal sheet and a signal propagation conductive circuit on the front surface are insulated from each other by a thermosetting resin composition. The semiconductor chip is connected to the conductive circuit formed on the printed wiring board surface by wire bonding. At least the conductive circuit on the printed wiring board surface is connected to a conductive circuit formed on the opposite surface of the printed wiring board, or to a conductive circuit pad formed, for being connected to an outside of the package with solder balls, with a conductive through hole insulated from the metal sheet via a resin composition. And, at least the semiconductor chip, the wire and the bonding pad are encapsulated with a resin.

The semiconductor plastic package has at least one via hole made in the opposite surface so as to be directly connected to the metal sheet, with the via hole having an inner wall rendered thermally conductive. The printed wiring board is provided, on the semiconductor-chip-mounting side, with an elevated portion, a plurality of protrusions each having the form of a frustum of a pyramid or a cone, or with a via hole having an inner wall rendered thermally conductive.

Further, according to the present invention, there is provided a semiconductor plastic package according to the above invention, wherein a plurality of the protrusions each having the form of a frustum of a cone each are in contact with the opposite surface of a copper foil, to the front surface of which the semiconductor chip is directly fixed.

According to the present invention, further, there is provided a semiconductor plastic package according to the above invention, wherein the at least one via hole is formed on the semiconductor-chip-mounting side directly below the semiconductor chip so as to be directly connected to the metal sheet.

According to the present invention, further, there is provided a semiconductor plastic package according to the above invention, wherein the metal sheet is formed of a copper alloy having a copper content of at least 95% by weight or pure copper.

According to the present invention, further, there is provided a semiconductor plastic package according to the above invention, wherein the thermosetting resin composition contains a polyfunctional cyanate ester or a prepolymer of the cyanate ester.

According to the present invention, there is also provided a method of producing a metal-sheet-possessing printed wiring board having a structure in which a metal sheet having a size nearly equivalent to a printed wiring board is disposed nearly in the central portion in the thickness direction of the printed wiring board. The metal sheet is insulated from conductive circuits on front and reverse surfaces with a thermosetting resin composition, and the conductive circuits on the front and reverse surfaces are connected to each other with a conductive through hole insulated with a thermosetting resin composition.

The method comprises forming a clearance hole or a slit hole in the metal sheet and in a position where the through hole is to be formed, providing each surface of the metal sheet with at least one of a prepreg, a resin sheet, a coating and a resin-applied metal foil, and placing a metal foil on any outer resin layer if no metal foil is present. The method further comprises laminate-forming the resultant set under heat and under pressure to provide an integrated metal-sheet-possessing copper-clad laminate, and to fill the clearance hole or the slit hole with a resin composition of the prepreg, the resin sheet, the coating or the resin-applied metal foil. The method further comprises, then making a penetration hole for the through hole so as to be out of contact with the metal sheet, making a via hole for heat diffusion in the opposite surface so as to be connected to the metal sheet, filling the via hole portion with a metal by metal plating, and electrically connecting the front and opposite surfaces by metal plating of the through hole. The method further comprises, forming circuits on the metal foils which are the front and opposite surfaces, coating any portion other than the semiconductor-chip-mounting portion, a bonding pad portion and a ball pad portion with a plating resist, and then carrying out noble metal plating.

According to the present invention, further, there is provided a method according to the above invention, wherein the semiconductor-chip-mounting side surface of the metal sheet has an elevated portion having the form of a frustum of a pyramid or a cone.

According to the present invention, further, there is provided a method according to the above invention, wherein a via hole for heat diffusion is also made on the semiconductor-chip-mounting side. The via hole is provided immediately below the semiconductor chip so as to be connected to the metal sheet, and the via hole is filled with the metal by performing metal plating.

DETAILED DESCRIPTION OF THE INVENTION

Symbols in drawings which are referred to as required for the explanation of the present invention have the following meanings; a: lead-free solder, b: metal sheet, c: clearance hole, d: metal foil, e: thermosetting resin composition layer, f: prepreg, g: through hole for the conduction of conductive circuits on front and opposite surfaces, h: encapsulating resin, i: semiconductor chip, j: silver paste, k: bonding wire, l: solder ball, m: plating resist, n: prepreg having a hole made in part thereof, o: through hole for heat diffusion, p: blind via hole for heat diffusion, q: etching resist, r: conductive circuit pad, s: bonding pad, t: double-side copper-clad laminate, w: protrusion, x: resin-foil laminate, and y: protrusions.

In the plastic package of the present invention, a metal sheet having excellent heat diffusion is disposed nearly in the central portion of a printed wiring board. The metal sheet has an elevated metal protrusion or a plurality of metal protrusions each having the form of a frustum of a cone, or a via hole which has an inner wall rendered thermally conductive and is connected to the metal sheet. Also provided is a plated through hole for the conduction of conductive circuits on the front and opposite surfaces of the printed wiring board, formed so as to have a diameter a little smaller than the diameter of a clearance hole or a little smaller than the width of a slit hole, and so as to be present nearly in the central portion a resin filled therein, whereby the plated through hole retains its insulation properties relative to the metal sheet.

In a method of fixing a semiconductor chip on the upper surface of a known metal sheet printed wiring board having a through hole, heat diffusion is effected, as in a conventional P-BGA package, by inevitably directing heat generated in the semiconductor chip into a heat-diffusion through hole positioned immediately below the semiconductor chip, and thus no popcorn phenomenon can be overcome.

In the present invention, an elevated protrusion or a plurality of protrusions each having the form of a frustum of a cone each are formed in advance in a position where a semiconductor chip is to be mounted on the metal sheet, by an aqqn etching method, or the like. When the via hole to be connected to the metal sheet is formed, it is not necessary to form the elevated protrusion or the protrusions each having the form of a frustum of a cone. Simultaneously, or at a later stage, further, a clearance hole or a slit hole having a size a little larger than the size of the through hole is formed in a position where the through hole is to be formed, by a known etching, punching, drilling or laser-applied method, so that the through hole for the conduction of the front and opposite surfaces can be formed.

The metal sheet having the elevated protrusion or the protrusions each having the form of a frustum of a cone and having the clearance hole or the slit hole is surface-treated, such as by performing an oxidation treatment, by forming of fine concave and convex portions or by forming a coating, by a known method as required for improving adhesion and electric insulation. The elevated protrusion or a plurality of the protrusions each having the form of a frustum of a cone are formed, a thermally conductive adhesive is applied thereon as required, and an insulating portion of a thermosetting resin composition is formed on the entire surface of the metal sheet having the clearance hole or the slit hole such that the elevated protrusion or the protrusions each having the form of a frustum of a cone are exposed to a slight extent thereafter. The formation of the insulating portion of a thermosetting resin composition uses a prepreg prepared by impregnating a substrate with a semi-cured thermosetting resin composition and drying the composition, a resin sheet or a resin-applied metal foil. Heat generated by a semiconductor chip is thermally conducted from its mounting portion to the metal sheet through the elevated protrusion or the protrusions each having the form of a frustum of a cone, and it is diffused to a mother board printed wiring board connected with solder balls, through the via hole formed in the opposite surface and directly connected to the metal sheet. The opposite surface is provided with a prepreg, a resin-applied metal foil, a resin sheet or an applied resin layer, with a metal foil disposed as required. The resultant set is laminate-formed under heat and under pressure, preferably in a vacuum, to integrate the metal sheet, resin and foil. There may be employed an embodiment in which a single-side metal-clad laminate, a single-side-circuit-formed double-side copper clad laminate or a single-side-circuit-formed multi-layered laminate is placed on each of the front and opposite surfaces, and the resultant laminate is laminate-formed under heat and under pressure, preferably, in a vacuum, to integrate the individual elements thereof.

The metal sheet may have a side surface of any form, such as side surface formed by covering it with a thermosetting resin composition or an exposed side surface. For preventing aerugo, it is preferred to form a structure in which the side surface is covered with a resin and no metal surface is exposed.

In a through hole printed wiring board according to a subtractive method, a metal foil having a size a little larger than the size of a printed wiring board is provided as each of the outermost front and opposite surfaces when the laminate-formation is carried out. The resultant set is laminate-formed under heat and under pressure, to form a metal-sheet-possessing metal-clad laminate whose front and opposite surfaces are coated with metal foils for forming outer-layer circuits.

When the laminate-formation is carried out without using metal foils as front and opposite surface layers, circuits are formed by a known additive method, to fabricate a printed wiring board.

In the board prepared by the above subtractive method or additive method, a small-diameter hole for a through hole for the conduction of circuits on the front and opposite surfaces is made in a portion other than a semiconductor-fixing portion, by a known method using a drill, a laser, or the like.

The hole for the through hole for the conduction of the circuits on the front and opposite surfaces is made nearly in the central portion of the metal sheet clearance hole or slit hole filled with the resin, such that it does not come into contact with the metal sheet. A desmear treatment is carried out as required, and then a metal layer is formed inside the through hole by electroless plating or electrolytic plating, to form a plated through hole. In a full additive method, circuits and pads for solder balls are simultaneously formed.

In a semi-additive method, the through hole is plated, and at the same time, the front and opposite surfaces are entirely plated, and then circuits are formed on the front and opposite surfaces by a known method.

A hole for the via hole is made by a generally known method using a laser, a mechanical drill, a plasma, or the like so as to reach the metal sheet, and optionally, a resin layer adhering to the metal sheet surface is removed by a desmear treatment, plasma treatment or low-pressure ultraviolet ray treatment. Then, the through hole is plated, and further, the via hole portion is plated. Preferably, the via hole is plated with copper so as to fill the via hole entirely, whereby the via hole portion is improved in the reliability of conductivity, and the heat-conducting area is also increased, as compared with a via hole wall plated with a metal, so that a plastic package having excellent heat diffusion properties can be obtained. The plating can be carried out by a generally known method. The via hole may be filled plating can be carried out by a generally known method. The via hole may be filled with a thermally conductive adhesive.

After the formation of circuits on the front and opposite surfaces, a plating of noble metal is formed on at least a wire bonding pad surface, to complete the printed wiring board. In this case, portions which require no noble metal plating are covered with a plating resist in advance. Otherwise, after the plating, a coating of a known thermosetting resin composition or a photo-selective thermosetting resin composition is formed on surfaces other than the semiconductor-chip-mounting portion, a bonding pad portion and a solder-ball-bonding pad portion on the opposite surface as required.

A thermally conductive adhesive is optionally applied to the top of the elevated protrusion or the protrusions each having the form of a frustum of a cone below the metal foil portion where a semiconductor chip is to be mounted, and the metal sheet is bonded to the metal foil during the laminate-formation, whereby the adhesion to the metal foil on the surface is improved and the resultant printed wiring board is excellent in reliability. A semiconductor chip is fixed on the above metal foil with a thermally conductive adhesive, and further, the semiconductor chip and the bonding pad of the circuit of the printed wiring board are connected by a wire bonding method, and at least the semiconductor chip, the bonding wire and the bonding pad are encapsulated with a known encapsulating resin.

A solder ball is connected to a solder-ball-connecting conductive pad on the surface opposite to the semiconductor-chip-mounting surface to prepare P-BGA. The solder ball is positioned on the circuit of a mother board printed wiring board, and the above package is connected to the mother board printed wiring board by thermally melting the solder ball. Otherwise, P-LGA is prepared without attaching any solder ball to the package, and when the package is mounted on a mother board printed wiring board, a solder-ball-connecting conductive pad formed on the mother board printed wiring board surface and a conductive pad for a solder ball for P-LGA are connected by melting the solder ball under heat.

Although not specially limited, the metal sheet for use in the present invention preferably has a high elastic modulus and a high thermal conductivity, and has a thickness of 30 to 500 µm. Specifically, preferred is a sheet formed of pure copper, a sheet formed of an oxygen-free copper or a sheet formed of an alloy containing at least 95% by weight of copper and a balance of Fe, Sn, P, Cr, Zr, Zn or the like. Further, a metal sheet prepared by plating an alloy with copper may be used.

The height of the thermally-conductive-adhesive-applied elevated protrusion or protrusions each having the form of a frustum of a cone is not specially limited, while it is preferably 50 to 150 µm. Further, the insulating layer such as the prepreg, the resin sheet, the resin-applied metal foil or the applied resin is adjusted so as to have a thickness a little smaller than the height of the elevated protrusion or the protrusions each having the form of a frustum of a cone, preferably smaller by about 5 to 15 µm, when the laminate formation is carried out. After the laminate formation, the insulating layer is connected to the metal foil on the surface. The elevated protrusion is not specially limited in size, while it generally has a base portion having a diameter of 0.1 to 5 mm and an upper portion having a diameter of 0 to 1 mm.

The thermally conductive adhesive can be selected from known adhesives. Specifically, it can include a silver paste, a copper paste, a solder paste, a lead-free solder containing tin, silver and copper. A region where the elevated protrusion or the protrusions each having the form of a frustum of a cone are formed has a size equivalent to, or smaller than, the area of a semiconductor chip. Generally, the above region has a square or rectangular area whose one side is 5 to 20 mm or less, and it is positioned below a portion where a semiconductor chip is to be mounted.

The resin for the thermosetting resin composition for use in the present invention can be generally selected from known thermosetting resins. Specific examples of the above resin include an epoxy resin, a polyfunctional syanate ester resin, a polyfunctional maleimide-cyanate ester resin, a polyfunctional maleimide resin and an unsaturated-group-containing polyphenylene ether resin, and these resins are used alone or in combination. In view of heat resistance, humidity resistance, anti-migration properties and electric characteristics after water absorption, a polyfunctional cyanate ester resin composition is preferred.

The polyfunctional cyanate ester compound which is a preferred thermosetting resin content in the present invention refers to a compound having at least two cyanato groups per molecule. Specific examples thereof include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl) propane, 2,2-bis(3,5-dibromo-4-cyanatophenyl)propane, bis (4-cyanatophenyl)ether, bis(4-cyanatophenyl)thioether, bis (4-cyanotophenyl)sulfone,tris (4-cyanatophenyl)phosphite, tris(4-cyanatophenyl)phosphate and cyanates obtained by a reaction between novolak and cyan halide.

Further, there may be used polyfunctional cyanate ester compounds disclosed in Japanese Patent Publications Nos. 41-1928, 42-18468, 44-4791, 45-11712, 46-41112 and 47-26853 and JP-A-51-63149. Furthermore, there may be used a prepolymer having a molecular weight of 400 to 6,000 and having a triazine ring formed by a dimerizing cyanato group of any one of these polyfunctional cyanate ester compounds. The prepolymer is obtained by polymerizing the above polyfunctional cyanate ester monomer in the presence of a catalyst which is selected from an acid such as a mineral acid or a Lewis acid, a base such as tertiary amine, e.g., sodium alcoholate, or a salt such as sodium carbonate. The prepolymer partially contains unreacted monomer and is in the form of a mixture of a monomer and a prepolymer, and it is also suitably used in the present invention. Generally, it is dissolved in an organic solvent in which it is soluble, before use.

The epoxy resin can be generally selected from known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin, a polyepoxy compound obtained by epoxidizing the double bond of butadiene, pentadiene, vinylcyclohexene or dicyclopentyl ether, a polyol, and a polyglycidyl compound obtained by a reaction between a hydroxyl-group-containing silicone resin and epohalohydrin. These resins may be used alone or in combination.

The polyimide resin can be generally selected from known polyimide resins. Specific examples thereof include reaction products of polyfunctional maleimides and polyamines, and polyimides having a triple-bond terminal disclosed in JP-B-57-005406.

The above thermosetting resins may be used alone, but they are preferably suitably used in combination in view of a balance in characteristics.

Various additives may be added to the thermosetting resin composition in the present invention so long as the inherent properties of the composition are not impaired. The above additives include monomers having polymerizable double bonds such as unsaturated polyester, prepolymers of these; liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber; polyethylene, polypropylene, polybutene, poly-4-methylpentene, polystyrene, AS resin, ABS resin, MBS resin, styrene-isoprene rubber, a polyethylene-propylene copolymer, 4-fluoroethylene-6-fluoroethylene copolymers; high-molecular-weight prepolymers or oligomers such as polycarbonate, polyphenylene ether, polysulfone, polyester and polyphenylene sulfide; and polyurethane. These additives are used as required. Further, various known additives such as an inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition in the present invention undergoes curing itself under heat. Since, however, its curing rate is low and is therefore poor in workability, economic performances, etc., a known heat-curing catalyst is incorporated into the thermosetting resin. The amount of the catalyst per 100 parts by weight of the thermosetting resin is 0.005 to 10 parts by weight, preferably 0.01 to 5 parts by weight A reinforcing material for the prepreg is generally selected from a known inorganic or organic woven fabric or non-woven fabric. Specific examples thereof include known glass fiber fabrics of E glass, S glass and D glass, a wholly aromatic polyamide fiber fabric, a liquid crystal polyester fiber fabric and a polybenzazole fiber fabric. These may be interwoven fabrics. Further, there may be used a material prepared by applying a thermosetting resin composition to both the surfaces of a film such as a polyimide film and heating the thermosetting resin composition to render it semi-cured.

The metal foil as each outermost layer can be generally selected from known metal foils. Preferably, a copper foil or a nickel foil having a thickness of 3 to 18 $\mu$m is used.

The clearance hole or the slit is formed so as to have a diameter or a width a little larger than the diameter of the through hole used for the conduction of front and opposite surfaces. Specifically, the wall of the through hole and the wall of the clearance hole or the slit hole are preferably insulated from each other with the thermosetting resin composition layer having a thickness of at least 50 $\mu$m. Although not specially limited, the diameter of the through hole used for the conduction of front and opposite surfaces is preferably 50 to 300 $\mu$m.

When the prepreg for use in the printed wiring board in the present invention is prepared, a substrate material is impregnated with a thermosetting resin composition and the thermosetting resin composition is dried to form a laminating material in a semi-cured state. Further, there may be also used a resin sheet which is rendered semi-cured without using any substrate material. In this case, the resin sheet is prepared as a high-flow, a low-flow or a no-flow sheet. A no-flow sheet is prepared such that the flow of the resin when the laminate formation is carried out under heat and under pressure is 100 $\mu$m or less, preferably 50 $\mu$m or less. In this case, essentially, the sheet can be bonded to the metal sheet and the metal foil without causing any voids. The temperature for the preparation of the prepreg is generally between 100° C. and 180° C. The time period therefor is 5 to 60 minutes, and it is properly selected depending upon the degree of the intended flow.

The production method of the present invention will be explained with reference to a method of producing a semiconductor plastic package having a plurality of protrusions each having the form of a frustum of a cone on the semiconductor-chip-mounting side and a via hole made in the opposite surface. The following explanation refers to FIGS. 1 and 2.

Figure 1:
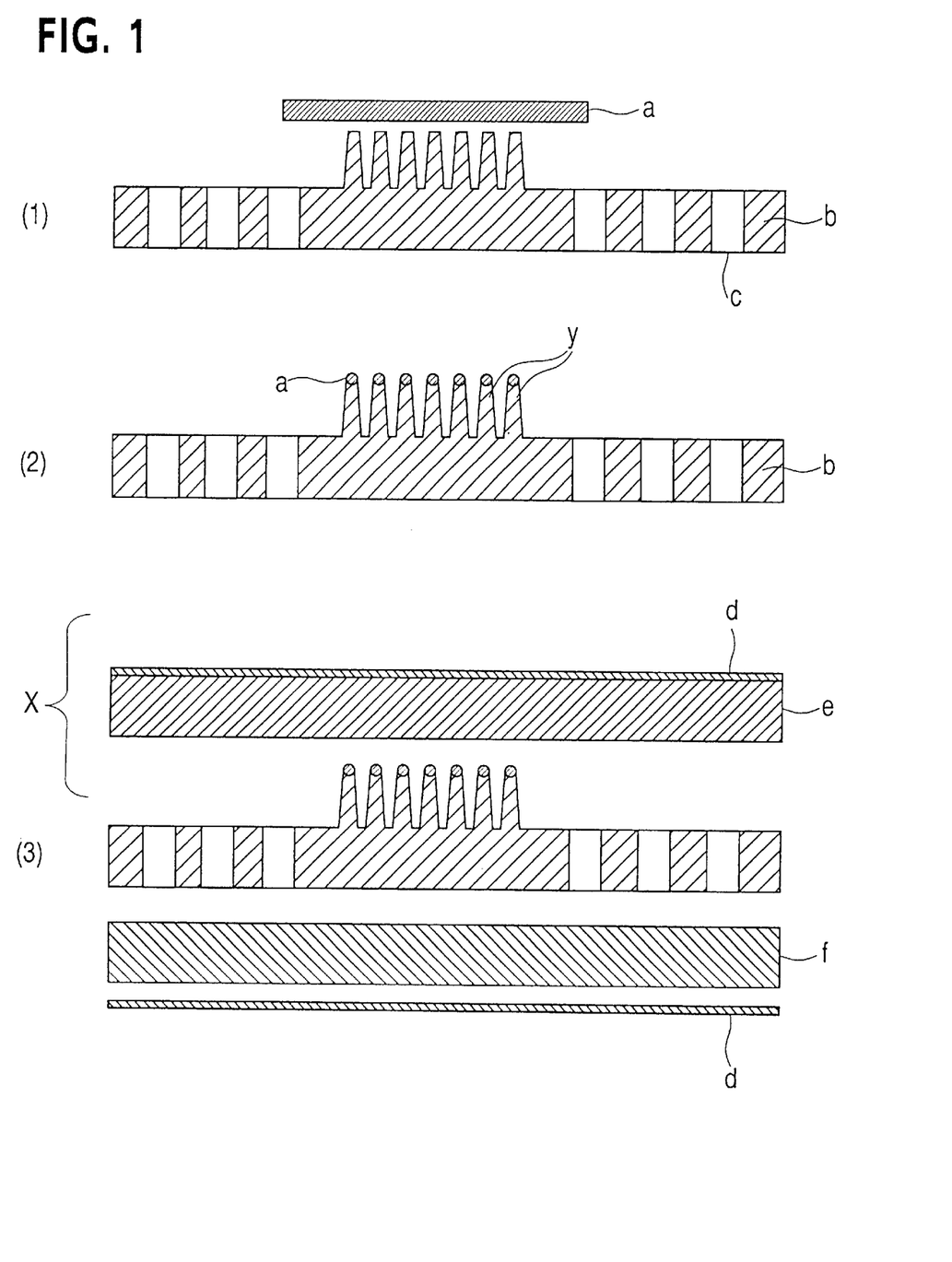
FIG. 1 shows steps of producing a semiconductor plastic package of Example 1.

As shown in FIG. 1, the entire surface of a metal sheet (b) which is to constitute an inner layer is covered with a liquid etching resist and heated to remove a solvent, and then, one surface of the metal sheet (b) is covered with a negative film prepared so as to leave a small circular form of the resist in a portion where a semiconductor chip is to be mounted. Irradiation with ultraviolet light is carried out, and then, portions other than circular exposed portions and the clearance hole portion on the opposite surface are dissolved and removed with a 1% sodium carbonate aqueous solution. The protrusions (y) each having the form of a frustum of a cone on the surface and the clearance hole are formed by dissolving a predetermined thickness of the metal sheet (b). Then the etching resist is removed, and the entire surface of the metal sheet is chemically treated.

A lead-free solder (a) is allowed to adhere to tops of the protrusions (y) each having the form of frustum of a cone.

And, a resin-foil laminate (x) in a semi-cured state, obtained by applying a thermosetting resin composition layer (e) to a metal foil (d) and drying the thermosetting resin composition layer (e), is placed on one surface of the metal sheet (b). In this case, the resin-foil laminate (x) is formed such that the tops of the protrusions (y) have a thickness that is a little smaller than the thickness of the metal foil (d). A prepreg, resin sheet or a coated resin layer (f) is provided on the opposite surface of the metal sheet (b), and a metal foil (d), a single-side metal-clad laminate, a single-side-circuit-formed double-side copper clad laminate or a single-side-circuit-formed multi-layered laminate is placed on the outer side of the prepreg, resin sheet or coated resin layer (f) as required.

Figure 2:
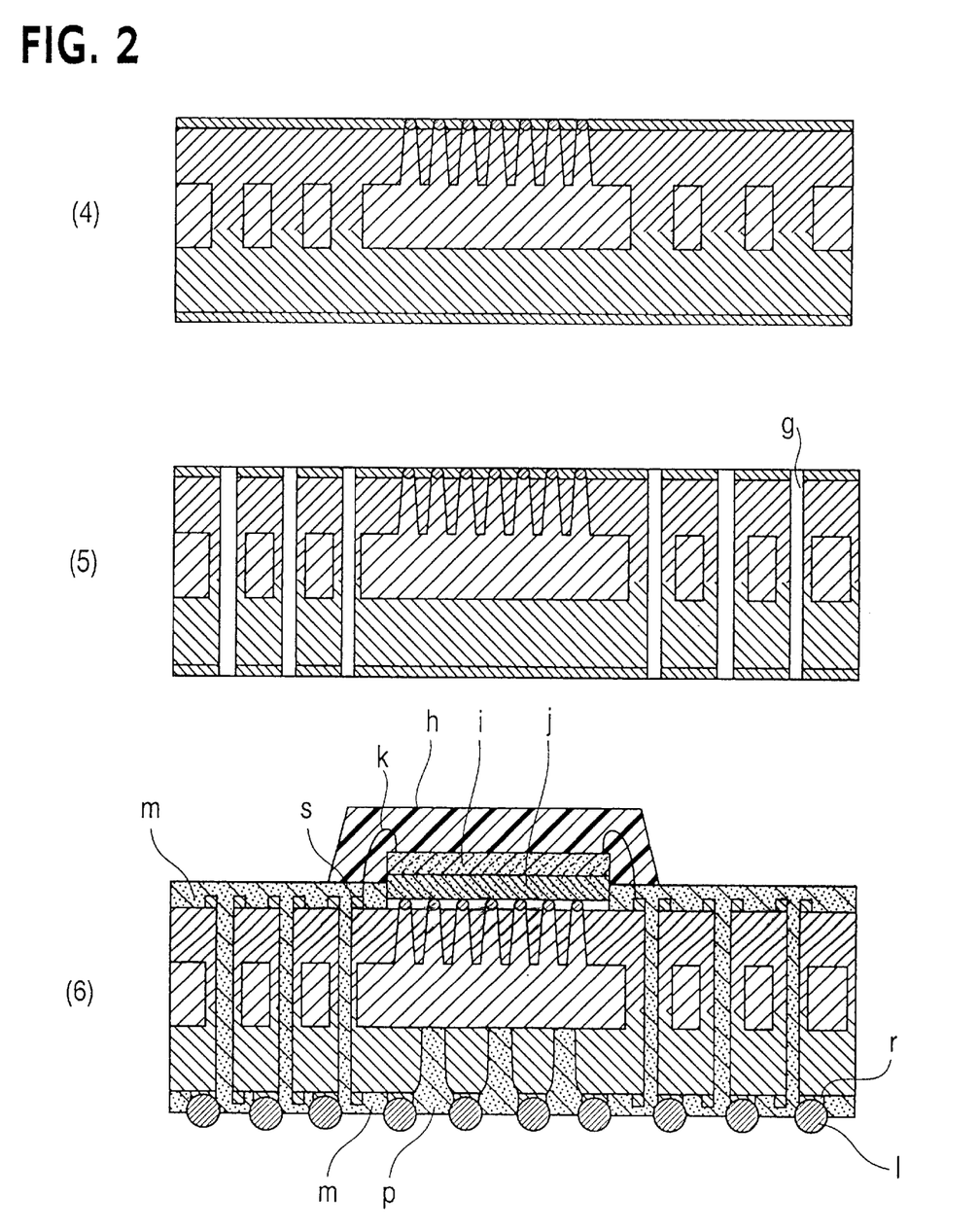
FIG. 2 also shows steps of producing the semiconductor plastic package of Example 1.

As shown in FIG. 2, the resultant structure is formed under heat and pressure in a vacuum into a laminate.

Then, a through hole (g) is made at a predetermined position in a state where it does not come in contact with the metal sheet (b).

And a blind via hole (p) is made in an opposite surface of the laminate with a mechanical drill, a laser, etc., so as to reach the metal sheet (b). A desmear treatment is carried out, then metal plating is carried out, and circuits on the upper and lower surfaces of the laminate are formed according to a known method. Surface portions other than a semiconductor-chip-mounting portion, a bonding pad portion and a solder ball pad portion on the opposite surface of the laminate are covered with a plating resist. Then, noble metal plating is carried out, a semiconductor chip (i) is bonded via a lead-free solder (j) onto the semiconductor-chip-mounting portion where the protrusions (y) of the metal sheet (b) are in contact with the metal foil (d), and wire bonding indicated by (k) is carried out. Then encapsulation with a resin (h) is carried out, and optionally, a solder ball (l) is bonded.

EXAMPLES

The present invention will be specifically explained with reference to Examples and Comparative Examples hereinafter. In addition, "part" stands for "part by weight" unless otherwise specified.

Example 1

900 Parts of 2,2-bis(4-cyanatophenyl)propane and 100 parts of bis(4-maleimidephenyl)methane were melted at 150° C., and allowed to react via stirring for 4 hours, to provide a prepolymer. The prepolymer was dissolved in mixed solvents of methyl ethyl ketone and dimethylformamide. To the resultant mixture were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 parts of zinc octylate was added, dissolved and mixed therein. To the resultant mixture was added 500 parts of an inorganic filler (trade name: Calcined Talc, supplied by Nippon Talc K.K.), and these materials were homogeneously stirred and mixed to prepare a varnish A. The above varnish was applied to a 100 $\mu$m thick glass woven fabric, and the varnish was dried to provide a semi-cured prepreg B having a gelation time of 50 seconds (at 170° C.), having a resin flow length of 10 mm under conditions of 170° C., 20 kgf/cm$^2$ and 5 minutes, and having an insulating layer thickness of 113 $\mu$m. The varnish A was applied to a treated surface of a 12 $\mu$m thick electrolytic copper foil and dried to give a resin-applied copper foil C having a gelation time of 65 seconds and having an insulating layer thickness of 114 $\mu$m.

As a metal sheet (b), a 200 $\mu$m thick alloy sheet having contents of Cu: 99.9%, Fe: 0.07% and P: 0.03% was provided. A liquid etching resist was applied to both the surfaces thereof to a thickness of 25 $\mu$m and dried, and a negative film which was prepared so as to leave circular forms of the resist having a diameter of 300 $\mu$m at intervals of 2 mm in a square area having a side of 13 mm in the center of a 50×50 mm-sized package to be formed, was covered on the front surface. A negative film prepared so as to remove the resist in a clearance hole portion was covered on the opposite surface, and after irradiation with ultraviolet light, non-exposed portions were dissolved and removed with a 1% sodium carbonate aqueous solution. Both the surfaces were etched to form 25 protrusions (y) each having the form of a frustum of a cone having a height of 117 $\mu$m, a base diameter of 520 $\mu$m and a top diameter of 250 $\mu$m, and at the same time to make a clearance hole (c) having a diameter of 0.6 mm. A lead-free solder (tin/silver/copper=96/3.5/0.5%) was allowed to adhere to tops of the protrusions (y) each having the form of a frustum of a cone. The above resin-applied copper foil C was placed on the upper surface, the prepreg B was placed on the lower surface, and a 12 $\mu$m thick electrolytic copper foil (d) was placed thereon. The resultant set was laminate-formed at 230° C. at 20 kgf/cm$^2$ under a vacuum of 30 mmHg or less for 2 hours to integrate the metal sheet, resin-applied copper foil, prepreg and copper foil. Through holes (g) having a diameter of 0.25 mm were made in the centers of the clearance hole portions such that they did not come into contact with the metal sheet (b). In a central square area of 13 mm×13 mm on the opposite surface, further, a hole having a diameter of 100 $\mu$m was made in the copper foil (d) by an etching method, and irradiation with a carbon dioxide gas laser was carried out to make a blind via hole (p) which reached the metal sheet (b). A desmear treatment was carried out, and copper plating was carried out by an electroless plating method or by an electroplating method, to form a 17 $\mu$m thick copper plating layer in the blind via hole (p). An etching resist was allowed to adhere to the front and opposite surfaces, and positive films were stacked, followed by exposure, development and the formation of circuits on the front and opposite surfaces. A plating resist was formed on portions other than the semiconductor-chip-mounting portion, a bonding pad portion and a ball pad portion, and nickel plating and gold plating were carried out to complete a printed wiring board. A semiconductor chip (i) having a 13×13 mm square size was bonded and fixed, with a silver paste (j), to the copper foil portion to which the protrusions (y) each having the form of a frustum of a cone were connected on the surface, and then wire bonding indicated by (k) was carried out. Then, the semiconductor chip portion, the wire portion and the bonding pad portion were encapsulated with a silica-containing epoxy encapsulating liquid resin (h), and the solder balls (l) were connected to prepare a semiconductor plastic package. The above semiconductor plastic package was connected to an epoxy resin mother board printed wiring board by melting the solder balls (l). Table 1 shows evaluation results.

Example 2

A printed wiring board was prepared in the same manner as in Example 1 except that the lead-free solder was not used, and a semiconductor plastic package was prepared in the same manner as in Example 1. Table 1 shows evaluation results.

Comparative Example 1

Figure 3:
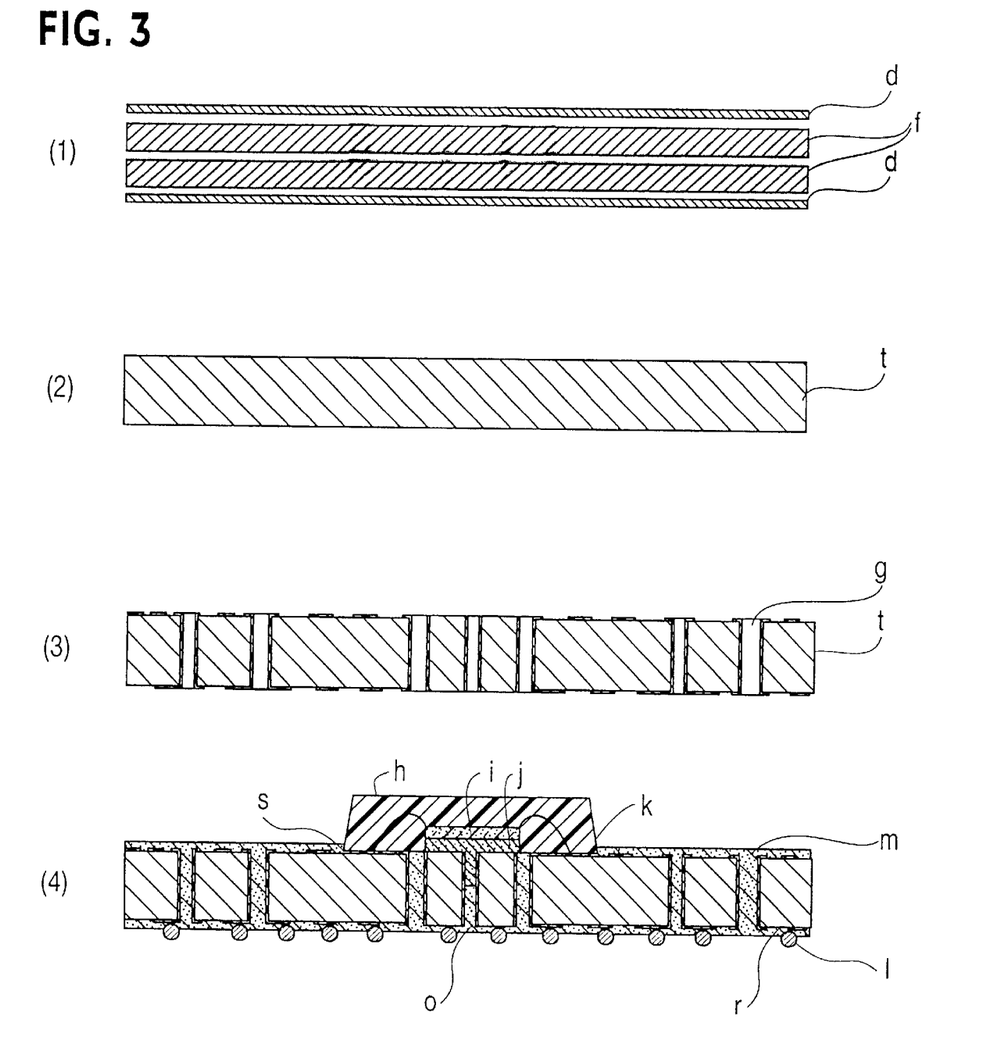
FIG. 3 shows steps of producing a semiconductor plastic package of Comparative Example 1.

As shown in FIG. 3, two sheets (f) of the prepreg B obtained in Example 1 were used. 12 μm thick electrolytic copper foils (d) were placed on respective upper and lower surfaces of the prepreg sheets (f), and the resultant structure was formed at 200° C. at 20 kgf/cm$^2$ under a vacuum of 30 mmHg or less for 2 hours, to provide a double-side copper-clad laminate (t). Through holes (g) each having a diameter of 0.25 mm were made at predetermined positions with a drill, and after a desmear treatment, copper plating was carried out Circuits were formed on the upper and lower surfaces of the laminate (t) according to a known method, the surfaces were covered with a plating resist, and then nickel plating and gold plating were carried out. In this case, the through holes (g) for heat diffusion were formed at a semiconductor-chip-mounting position. A semiconductor chip (i) was bonded thereon with a silver paste (j), and after wire bonding indicated by (k), encapsulation with an epoxy encapsulating compound (h) was carried out in the same manner as in Example 1. Solder balls (l) were bonded. Similarly, bonding to a mother board was carried out in the same manner as in Example 1. Table 1 shows evaluation results.

Comparative Example 2

Parts of an epoxy resin (trade name: Epikote 5045), 300 parts of an epoxy resin (trade name: ESCN220F), 35 parts of dicyandiamide and 1 part of 2-ethyl-4-methylimidazole were homogeneously dissolved in mixed solvents of methyl ethyl ketone and dimethylformamide, and the resultant mixture was used to impregnate a 100 μm thick glass woven fabric and dried to provide a no-flow prepreg (prepreg D) having a gelation time of 10 seconds (at 170° C.) and a resin flow length of 98 μm, and a high-flow prepreg (prepreg E) having a gelation time of 150 seconds and a resin flow length of 18 mm.

Figure 4:
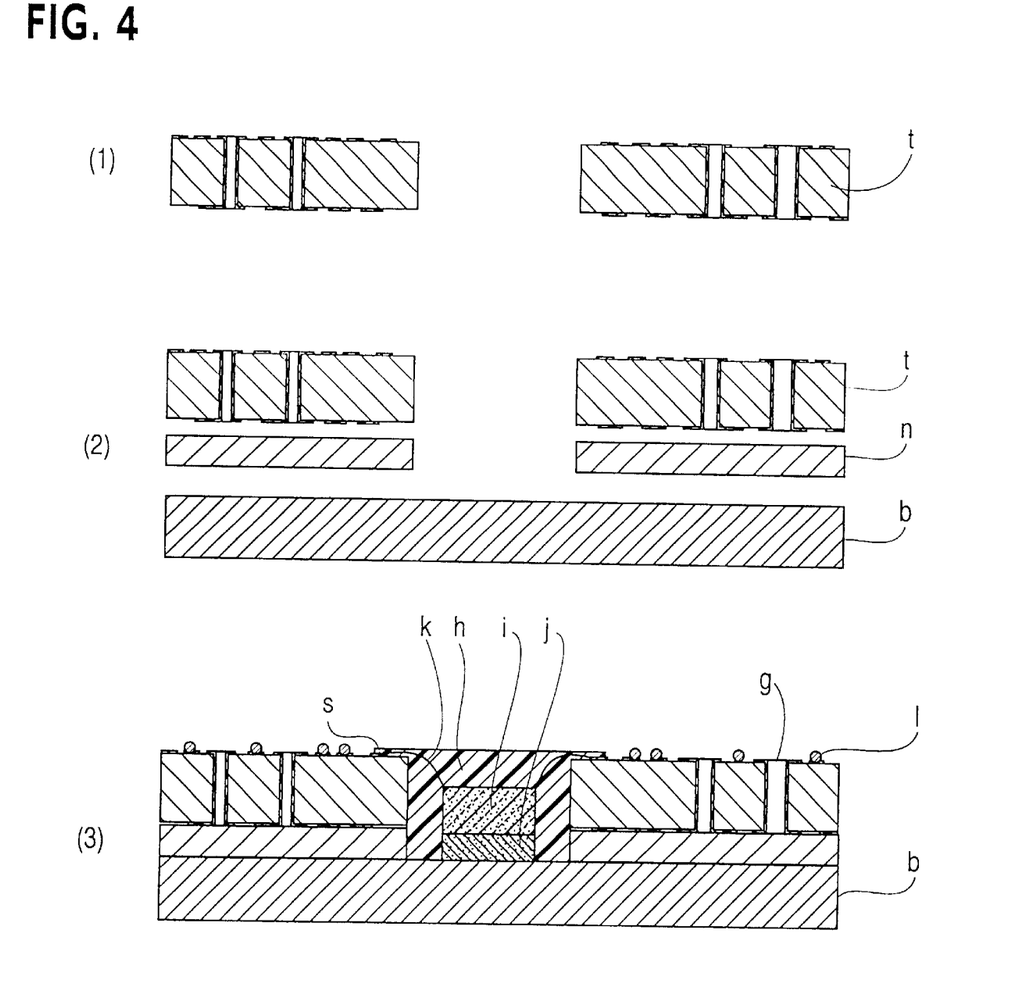
FIG. 4 shows steps of producing a semiconductor plastic package of Comparative Example 2.

As shown in FIG. 4, two sheets of the prepreg E were used. Laminate formation was carried out at 190° C. at 20 kgf/cm$^2$ under a vacuum of 30 mmHg or less for 2 hours, to provide a double-side copper-clad laminate (t). Thereafter, a printed wiring board was prepared in the same manner as in Comparative Example 1. A hole was made in a semiconductor-chip-mounting portion with a counter-boring machine, and a 200 μm thick copper sheet (b) was bonded to an opposite surface, via a sheet (n), prepared by punching the above no-flow prepreg D, by applying heat and pressure, to provide a heat-radiator-applied printed wiring board. The printed wiring board was distorted to some extent. A semiconductor chip (i) was bonded directly to the heat radiator with a silver paste (j), wire bonding indicated by (k) was carried out, and the semiconductor chip (i) was encapsulated with a liquid epoxy resin (h). The printed wiring board was bonded to a mother board printed wiring board. Table 1 shows evaluation results.

TABLE 1

| Item | | Example 1 | Example 2 | Comparative Example 1 | Comparative Example 2 |
|---|---|---|---|---|---|
| Heat resistance[1] after water absorption | Ordinary state | No failure | No failure | No failure | No failure |
| | 24 hours | No failure | No failure | No failure | No failure |
| | 48 hours | No failure | No failure | No failure | No failure |
| | 72 hours | No failure | No failure | No failure | No failure |
| | 96 hours | No failure | No failure | No failure | partly peeled |
| | 120 hours | No failure | No failure | partly peeled | partly peeled |
| | 144 hours | No failure | No failure | Partly peeled | partly peeled |
| | 168 hours | No failure | No failure | Partly peeled | Partly peeled |
| Heat resistance[2] after water absorption | Ordinary state | No failure | No failure | No failure | No failure |
| | 24 hours | No failure | No failure | Partly peeled | partly peeled |
| | 48 hours | No failure | No failure | largely peeled | largely peeled |
| | 72 hours | No failure | No failure | Wire broken | Wire broken |
| | 96 hours | No failure | No failure | Wire broken | Wire broken |
| | 120 hours | No failure | No failure | Wire broken | Wire broken |
| | 144 hours | No failure | No failure | — | — |
| | 168 hours | No failure | No failure | — | — |
| GTT | (° C.) | 237 | 237 | 234 | 160 |
| Insulation resistance (Ω) after pressure cooker treatment | Ordinary state | $4 \times 10^{14}$ | $5 \times 10^{14}$ | $6 \times 10^{14}$ | $5 \times 10^{14}$ |
| | 200 hours | $6 \times 10^{12}$ | $5 \times 10^{12}$ | $5 \times 10^{12}$ | $2 \times 10^{8}$ |
| | 500 hours | $6 \times 10^{11}$ | $3 \times 10^{11}$ | $3 \times 10^{11}$ | $<10^{8}$ |
| | 700 hours | $5 \times 10^{10}$ | $6 \times 10^{10}$ | $2 \times 10^{10}$ | — |
| | 1000 hours | $2 \times 10^{10}$ | $1 \times 10^{10}$ | $1 \times 10^{10}$ | — |
| Anti-migration Properties (Ω) | Ordinary state | $6 \times 10^{13}$ | $6 \times 10^{13}$ | $4 \times 10^{13}$ | $6 \times 10^{13}$ |
| | 200 hours | $5 \times 10^{11}$ | $4 \times 10^{11}$ | $4 \times 10^{11}$ | $3 \times 10^{9}$ |
| | 500 hours | $4 \times 10^{11}$ | $4 \times 10^{11}$ | $4 \times 10^{11}$ | $<10^{8}$ |
| | 700 hours | $1 \times 10^{11}$ | $2 \times 10^{11}$ | $1 \times 10^{11}$ | — |
| | 1000 hours | $9 \times 10^{10}$ | $1 \times 10^{10}$ | $8 \times 10^{10}$ | — |
| Heat diffusibility | (° C.) | 35 | 36 | 56 | 48 |
| Adhesion to copper foil on surface | | Excellent | Good | — | — |

GTT = Glass transition temperature

<Measurement Methods>

1) Heat resistance[1] after water absorption: JEDEC STANDARD TEST METHOD A113-A LEVEL 3: After treatment at 30° C. at 60% RH for a predetermined period of time, and after 3 cycles of 220° C. reflow soldering, a substrate was evaluated for failures by observing its cross section and electric checking.

2) Heat resistance[2] after water absorption: JEDEC STANDARD TEST METHOD A113-A LEVEL 2: After treatment at 85° C. at 60% RH for a predetermined period of time (max. 168 hours), and after 3 cycles of 220° C. reflow soldering, a substrate was evaluated for failures by observing its cross section and electric checking.

3) Glass transition temperature: Measured by DMA method.

4) Insulation resistance value after treatment with pressure cooker: A inter-terminal (line/space=70/70 μm) comb type pattern was prepared, each prepreg used was placed thereon or a resin layer was formed, and the resin was cured. The resultant laminate was treated at 121° C. under two atmospheric pressures for a predetermined period of time and then treated at 25° C. at 60% RH for 2 hours, and after 500 VDC was applied for 60 seconds, an insulation resistance value between terminals was measured.

5) Anti-migration properties: The test piece in the above 4) was measured for an insulation resistance value between terminals at 85° C. at 85% RH under an applied charge of 50 VDC.

6) Heat diffusibility

A package was bonded to a mother board printed wiring board with solder balls and continuously used for 1,000 hours, and the package was measured for a temperature.

7) Adhesion to metal foil as surface layer

Cross sections of all of protrusions having the form of frustum of a cone were observed.

Example 3

A 100 μm thick glass woven fabric was impregnated with the varnish A obtained in Example 1, and the varnish was dried so as to attain a gelation time of 50 seconds (at 170° C.) and a resin flow length of 10 mm at 170° C. at 20 kgf/cm$^2$ for 5 minutes. There were obtained a semi-cured prepreg G having an insulating layer thickness of 140 μm and a prepreg H having a gelation time of 7 seconds and a resin flow length of 95 μm, and having an insulating layer thickness of 126 μm.

Figure 5:
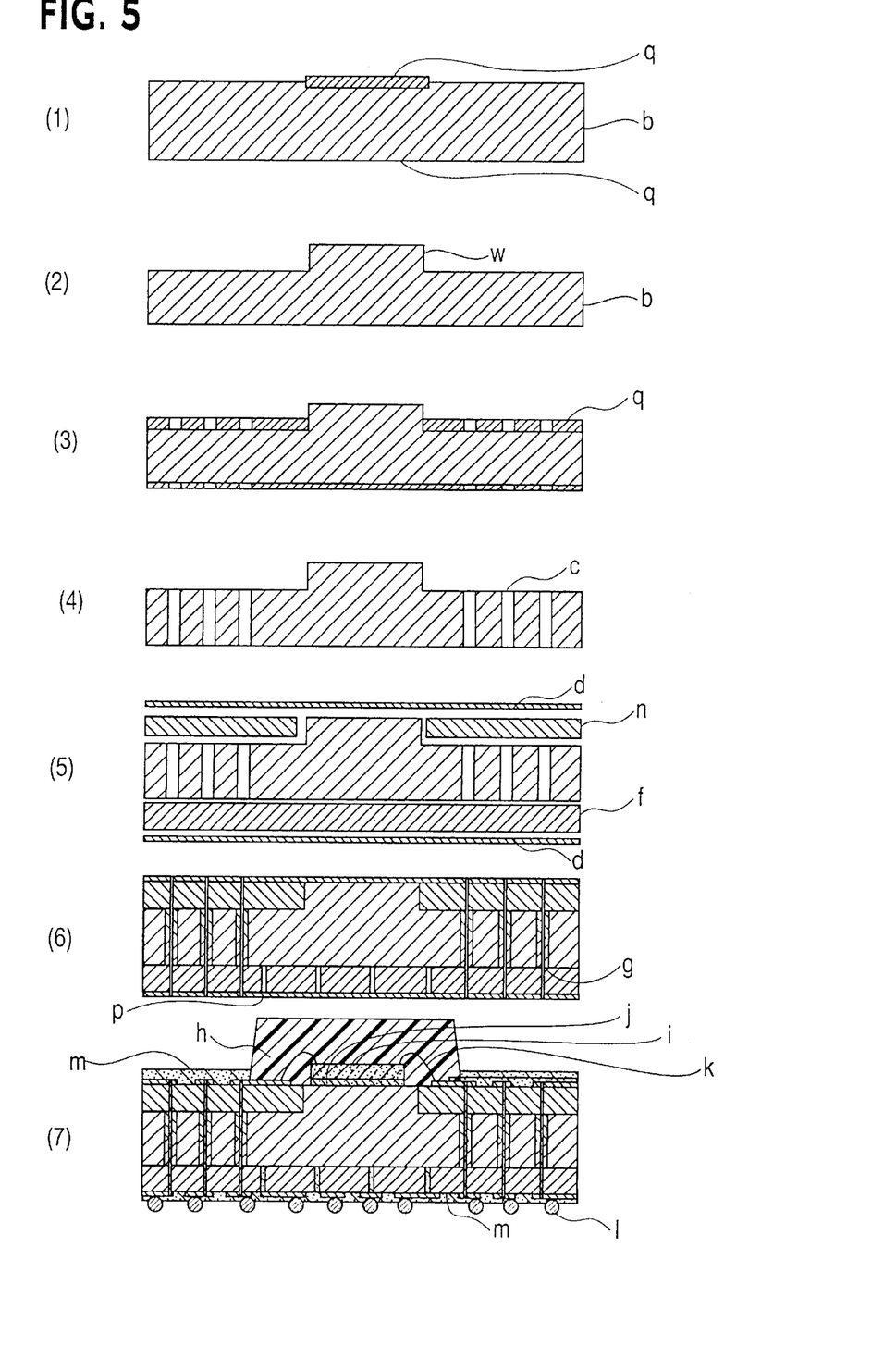
FIG. 5 shows steps of steps of producing a semiconductor plastic package of Example 3.

As shown in FIG. 5, as an inner-layer metal sheet (b), a 100 μm thick alloy sheet having contents of Cu: 99.9%, Fe: 0.07% and P: 0.03% was provided. A liquid etching resist (q) was applied to both the surfaces thereof to a thickness of 25 μm and dried. The etching resist having a square area having a side of 13 mm was left in the center of a surface area which was to constitute a 50×50 mm-sized package, and the etching resist was left on portions other than clearance holes. Both the surfaces were etched to form an elevated protrusion (w) having a square form whose side was 13 mm and height was 120 μm in the central portion of the front surface, and to form clearance holes (c) having a diameter of 0.6 mm. The entire surface of the metal sheet (b) was treated to form black copper oxide. One sheet (n) which was from the prepreg H and had a hole made to have a size a little larger than the size of the metal elevated protrusion (w) was placed on the front surface of the sheet (b), one sheet (f) from the prepreg G was placed on the opposite surface of the sheet (b), and 12 μm thick electrolytic copper foils (d) were placed thereon, respectively. The resultant structure was formed at 200° C. at 20 kgf/cm$^2$ under a vacuum of 30 mmHg or less for 2 hours, to fill the resin in the clearance holes (c) and to integrate the metal sheet (b), the sheets (n) and (b) and the copper foils (d), wherby a laminate was formed.

Through the center of each filled clearance hole, a through hole having a diameter of 0.25 mm was made with a drill such that these through holes did not come into contact with the metal sheet. Further, 625 blind via holes (p) each having a diameter of 120 μm each were made from the opposite surface with a carbon dioxide gas laser so as to reach the metal sheet, and a plasma treatment and a desmear treatment were carried out. Then, copper plating was carried out, to effect copper plating in the through holes. Further, the blind via holes (p) in the opposite surface were filled by carrying out copper plating. Then, circuits were formed on the front and opposite surfaces, portions other than the semiconductor-chip-mounting portion on the front surface, the bonding pad portion and the ball pad portion on the opposite surface were covered with a plating resist, and nickel plating and gold plating were carried out to provide a printed wiring board.

A semiconductor chip (i) having a square size of 13×13 mm was bonded and fixed to the elevated protrusion (w) of the metal sheet, which protrusion (w) was the semiconductor-chip-mounting portion on the front surface, with a silver paste (j), and then wire bonding was carried out. Then, the semiconductor chip portion, the wire portion and the bonding pad portion were encapsulated with a silica-containing epoxy encapsulating liquid resin (h), and solder balls (l) were bonded to solder ball pads on the opposite surface, to provide a semiconductor plastic package. The semiconductor plastic package was bonded to an epoxy resin mother board printed wiring board by melting the solder balls (l). Table 2 shows evaluation results.

Example 4

A 100 μm thick glass woven fabric was impregnated with the varnish A obtained in Example 1, and the varnish was dried so as to attain a gelation time of 50 seconds (at 170° C.) and a resin flow length of 10 mm at 170° C. at 20 kgf/cm$^2$ for 5 minutes. There was obtained a semi-cured prepreg I having an insulating layer thickness of 120 μm.

Figure 6:
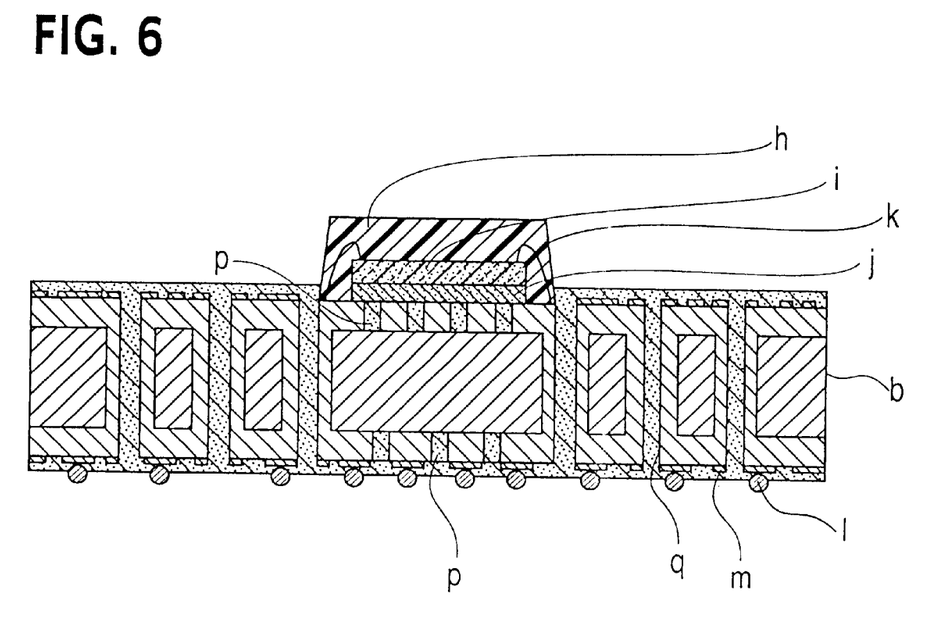
FIG. 6 shows a printed wiring board of Example 4.

As shown in FIG. 6, as a inner-layer metal sheet (b), a 100 μm thick alloy sheet having contents of Cu: 99.9%, Fe: 0.07% and P: 0.03% was provided. A liquid etching resist (q) was applied to both the surfaces thereof to a thickness of 25 μm and dried. The etching resist was removed from portions which were portions where clearance holes were to be made and were other than a square area having a side of 13 mm in the center of a surface area which was to constitute a 50×50 mm-sized package, and the etching resist in clearance hole portions was similarly removed on the opposite surface of the sheet (b). Both the surfaces of the sheet (b) were etched to form clearance holes having a diameter of 0.65 μm. The entire surface of the metal sheet was treated to form black copper oxide. Sheets which were from the prepreg I were placed on both surfaces of the sheet (b), respectively, and 12 μm thick electrolytic copper foils were placed thereon, respectively. The resultant structure was formed at 200° C. at 20 kgf/cm$^2$ under a vacuum of 30 mmHg or less for 2 hours, to fill the resin into the clearance holes and to integrate the sheet (b), the sheets of prepreg and the copper foils to form a laminate.

Through the center of each filled clearance hole, a through hole having a diameter of 0.25 mm was made with a drill such that these through holes did not come into contact with the metal sheet (b). Further, blind via holes (p) each having a diameter of 120 μm were made from front and opposite surfaces of the laminate with a carbon dioxide gas laser so as to reach the metal sheet (b), and a desmear treatment was carried out. Then, copper plating was carried out to effect copper plating in the through holes. Further, the blind via holes (p) in the front and opposite surfaces were filled by depositing a copper plating. Then, circuits were formed on the front and opposite surfaces, portions other than the semiconductor-chip-mounting portion on the front surface, the bonding pad portion and the ball pad portion on the opposite surface were covered with a plating resist (m), and nickel plating and gold plating were carried out to provide a printed wiring board.

A semiconductor chip (i) having a square size of 13×13 mm was bonded and fixed to one of the via hole portions, which was the semiconductor-chip-mounting portion on the front surface, with a silver paste (j), and then wire bonding indicated by (k) was carried out. Then, the semiconductor chip portion, the wire portion and the bonding pad portion were encapsulated with a silica-containing epoxy encapsulating compound (h), and solder balls (l) were bonded to solder ball pads on the opposite surface to provide a semiconductor plastic package. The semiconductor plastic package was bonded to an epoxy resin mother board printed wiring board by melting the solder balls (l). Table 2 shows evaluation results.

TABLE 2

|  |  | Example | |
|---|---|---|---|
| Item |  | 3 | 4 |
| Heat resistance[A] | Ordinary state | No failure | No failure |
| after water absorption | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| Heat resistance[B] | Ordinary state | No failure | No failure |
| after water absorption | 24 hours | No failure | No failure |
|  | 48 hours | No failure | No failure |
|  | 72 hours | No failure | No failure |
|  | 96 hours | No failure | No failure |
|  | 120 hours | No failure | No failure |
|  | 144 hours | No failure | No failure |
|  | 168 hours | No failure | No failure |
| GTT |  | (° C.) | 234 | 234 |
| Heat diffusibility performance |  | (° C.) | 35 | 32 |

GTT = Glass transition temperature

Industrial Utility

According to the present invention, there is provided a semiconductor plastic package having a structure in which heat generated by a semiconductor chip is conducted to the metal sheet through the elevated portion, which can include protrusions. The protrusions each having the form of frustum of a cone, or the via hole, is directly connected to the metal sheet and rendered thermally conductive, and reaches the solder ball through the opposite-surface via hole directly connected to the metal sheet and is diffused into a mother board printed wiring board. A method of producing a printed wiring board for use in the semiconductor plastic package is also provided. The present invention has the above structure and therefore provides a semiconductor plastic package having a novel structure, which is excellent in heat diffusion performances, absorbs no water through the lower surface of a semiconductor chip and is greatly improved in water resistance after water absorption, i.e., resistance against a popcorn phenomenon, and which is also suitable for mass production and is therefore improved with regard to economic performances. A method of producing a printed wiring board for use in the semiconductor plastic package is also provided.

What is claimed is:

1. A semiconductor package comprising:
 a printed wiring board having a first surface and an oppositely facing second surface;
 a metal sheet within said printed wiring board;
 at least one semiconductor chip on said first surface of said printed wiring board;
 a first conductive circuit on said first surface of said printed wiring board, with said first conductive circuit and said metal sheet being electrically insulated from each other, and with said first conductive circuit and said at least one semiconductor chip being electrically connected to each other;
 at least one of a second conductive circuit and a resin-encapsulated conductive circuit pad on said second surface of said printed wiring board and electrically insulated from said metal sheet, with said first conductive circuit being electrically connected to said at least one of a second conductive circuit and a conductive circuit pad;
 at least one blind via hole extending from said second surface of said printed wiring board to said metal sheet, with said at least one blind via hole being defined by a thermally conductive inner wall; and
 at least one of an elevated metal portion and at least one blind via hole, defined by a thermally conductive inner wall, in said printed wiring board between said first surface and said metal sheet.

2. The semiconductor package according to claim 1, wherein said metal sheet has a cross-sectional area that is substantially equal to a corresponding cross-sectional area of said printed wiring board, with said metal sheet being located generally centrally within said printed wiring board.

3. The semiconductor package according to claim 1, wherein said at least one semiconductor chip is encapsulated with a resin and is fixed to said first surface of said printed wiring board via a thermally conductive adhesive.

4. The semiconductor package according to claim 1, wherein said first conductive circuit comprises a signal propagation conductive circuit.

5. The semiconductor package according to claim 1, wherein said first conductive circuit and said metal sheet are electrically insulated from each other by a thermosetting resin composition.

6. The semiconductor package according to claim 1, wherein said first conductive circuit and said at least one semiconductor chip are electrically connected to each other via a wire that is bonded to said first conductive circuit and said at least one semiconductor chip, with said wire being encapsulated with a resin.

7. The semiconductor package according to claim 1, wherein said first conductive circuit is electrically connected to said at least one of a second conductive circuit and a conductive circuit pad via solder and a conductive through hole.

8. The semiconductor package according to claim 1, wherein said at least one of a second conductive circuit and a conductive circuit pad is electrically insulated from said metal sheet by a resin material.

9. The semiconductor package according to claim 1, wherein the elevated metal portion comprises metal protrusions each shaped as a frustum of a cone.

10. The semiconductor package according to claim 9, wherein said first surface of said printed wiring board includes a copper foil having a first surface and an oppositely facing second surface, said metal protrusions are in contact with said second surface of said copper foil, and said at least one semiconductor chip is fixed to said first surface of said copper foil via a thermally conductive adhesive.

11. The semiconductor package according to claim 10, wherein said metal protrusions are bonded to said copper foil via a thermally conductive adhesive.

12. The semiconductor package according to claim 1, wherein the at least one blind via hole in said printed wiring board between said first surface and said metal sheet is beneath said at least one semiconductor chip, and the thermally conductive inner wall that defines the at least one blind via hole in said printed wiring board between said first surface and said metal sheet comprises a plating.

13. The semiconductor package according to claim 1, wherein the thermally conductive inner wall that defines the at least one blind via hole extending from said second surface of said printed wiring board to said metal sheet comprises a plating.

14. The semiconductor package according to claim 1, wherein said metal sheet is of a material from the group consisting of a copper alloy having a copper content of at least 95% by weight and pure copper.

15. The semiconductor package according to claim 5, wherein said thermosetting resin composition includes one of a polyfunctional cyanate ester and a prepolymer of a cyanate ester.

16. A method of producing a printed wiring board, comprising:

forming a hole in a metal sheet that has a first surface and an oppositely facing second surface;

providing a first electrical insulation on said first surface of said metal sheet and providing a second electrical insulation on said second surface of said metal sheet;

providing a first metal foil on said first electrical insulation and providing a second metal foil on said second electrical insulation such that, after the provision of said first electrical insulation on said first surface of said metal sheet and said second electrical insulation on said second surface of said metal sheet, said first electrical insulation is between said first metal foil and said first surface of said metal sheet and said second insulation is between said second metal foil and said second surface of said metal sheet, whereby a composite of said metal sheet, said first and second electrical insulations, and said first and second metal foils is produced;

subjecting said composite to heat and pressure such that at least one of said first electrical insulation and said second electrical insulation fills said hole in said metal sheet, whereby a laminate of said metal sheet, said first and second electrical insulations, and said first and second metal foils is produced;

forming through said laminate a passage that coincides with said hole formed in said metal sheet such that, after formation of said passage, at least one of said first electrical insulation and said second electrical insulation exists between said metal sheet and an inner wall that defines said passage;

forming in said laminate a blind via hole that extends from said second metal foil to said metal sheet, and plating with metal an inner wall that defines said blind via hole;

electrically connecting said first metal foil to said second metal foil by plating with metal said inner wall that defines said passage;

forming conductive circuits on said first metal foil and said second metal foil;

coating portions of said laminate with a plating resist, and then plating said laminate with nickel and gold.

17. The method according to claim 16, wherein said first electrical insulation and said second electrical insulation are selected from the group consisting of prepregs, resin sheets and coatings.

18. The method according to claim 16, wherein said first electrical insulation comprises a first resin sheet having an attached first metal foil and said second electrical insulation comprises a second resin sheet having an attached second metal foil, with said first attached metal foil being said first metal foil provided on said first electrical insulation and said second attached metal foil being said second metal foil provided on said second electrical insulation.

19. The method according to claim 16, wherein said laminate includes at least one of a semiconductor chip mounting portion, a bonding pad portion and a ball pad portion, and wherein the coating of portions of said laminate with a plating resist comprises not coating said at least one of a semiconductor chip mounting portion, a bonding pad portion and a ball pad portion.

20. The method according to claim 16, wherein said laminate of said metal sheet, said first and second electrical insulations, and said first and second metal foils includes said metal sheet having a cross-sectional area that is substantially equal to corresponding cross-sectional areas of said first and second insulations and first and second metal foils, and being generally centrally located between said first and second metal foils.

21. The method according to claim 16, wherein said first and second metal foils each comprise copper.

22. The method according to claim 16, wherein a semiconductor chip mounting portion is provided on said first metal foil, and said first surface of said metal sheet includes an elevated portion shaped as a frustum of a cone.

23. The method according to claim 16, wherein a semiconductor chip mounting portion is provided on said first metal foil, and further comprising forming a blind via hole that extends from beneath the semiconductor mounting portion to said metal sheet, and plating with metal an inner wall that defines said blind via hole which extends from beneath said semiconductor mounting portion to said metal sheet.

* * * * *